US007020015B1

(12) United States Patent
Hong et al.

(10) Patent No.: US 7,020,015 B1
(45) Date of Patent: Mar. 28, 2006

(54) MAGNETIC ELEMENTS HAVING UNIQUE SHAPES

(75) Inventors: Yang-Ki Hong, Pullman, WA (US); Mun-Hyoun Park, Moscow, ID (US); Sung-Hoon Gee, Moscow, ID (US)

(73) Assignee: Idaho Research Foundation, Inc., Moscow, ID (US)

( * ) Notice: Subject to any disclaimer, the term of this patent is extended or adjusted under 35 U.S.C. 154(b) by 144 days.

(21) Appl. No.: 10/674,361

(22) Filed: Sep. 29, 2003

Related U.S. Application Data

(60) Provisional application No. 60/416,213, filed on Oct. 3, 2002.

(51) Int. Cl.
*G11C 11/14* (2006.01)

(52) U.S. Cl. ...................................... 365/171; 365/173

(58) Field of Classification Search ................ 365/171, 365/173
See application file for complete search history.

(56) References Cited

U.S. PATENT DOCUMENTS

| | | | | |
|---|---|---|---|---|
| 5,629,922 | A | 5/1997 | Moodera et al. | |
| 5,923,583 | A | 7/1999 | Womack | |
| 5,969,978 | A | 10/1999 | Prinz | |
| 6,292,389 | B1 | 9/2001 | Chen et al. | |
| 6,396,735 | B1 | 5/2002 | Michijima et al. | |
| 6,906,369 | B1 * | 6/2005 | Ross et al. | 365/173 |
| 6,906,947 | B1 * | 6/2005 | Bloomquist et al. | 365/158 |
| 6,940,750 | B1 * | 9/2005 | Yamamoto et al. | 365/171 |
| 2002/0109172 | A1 | 8/2002 | Okazawa | |

OTHER PUBLICATIONS

Chen et al., *J. Appl. Phys.* 81(8):3992-3994, 1997.
Chui, *Appl. Phys. Lett.* 68(25):3641-3643, 1996.
Cowburn et al., *Physical Review Letters* 83(5):1042-1045, 1999.
Cowburn et al., *J. Phys. D: Appl. Phys.* 33:R1-R16, 2000
Guslienko et al., *Phys. Rev. B.* 65:024414(1-10), 2001.
Kikuchi et al., *IEEE Transactions on Magnetics* 37(4):2082-2084, 2001.
Kirk et al., *Appl. Phys. Lett.* 71(4):539-541, 1997.
König et al.,*Appl. Phys. Lett.* 79(22):3648-3650, 2001.
Lopez-Diaz et al., *IEEE Transactions on Magnetics* 36(5): 3155-3157, 2000.
Novosad et al., *Phys. Rev. B.* 65:060402(1-4), 2002.
Park et al., *J. Appl. Phys.* 91(10):7218-7220, 2002.

(Continued)

*Primary Examiner*—Tuan T. Nguyen
(74) *Attorney, Agent, or Firm*—Klarquist Sparkman, LLP

(57) ABSTRACT

Magnetic elements having unique shapes. In one example, the magnetic element defines an outer peripheral profile and a center point, wherein the outer peripheral profile includes a substantially curviform section and a notch section. The notch section may be configured to radially extend to at least the center point. In another example, a substantially circular or oval-shaped magnetic element defines an outer periphery and a gap void having an open end facing the outer periphery so as to form a gap along the outer periphery. The magnetic element optionally may not include an annular void that is spatially isolated from the gap void.

11 Claims, 8 Drawing Sheets

OTHER PUBLICATIONS

Parkin et al., *J. Appl. Phys.* 85(8):5828-5833, 1999.
Portier et al., *Appl. Phys. Lett.* 76(6):754-756, 2000.
Pulwey et al., *IEEE Transactions on Magnetics* 37(4):2076-2078, 2001.
Rothman et al., *Physical Review Letters* 86(6):1098-1101, 2001.
Schneider et al., *Appl. Phys. Lett.* 77(18):2909-2911, 2000.
Schneider et al., *Appl. Phys. Lett.* 79(19):3113-3115, 2001.
Schrefl et al., *J. Appl. Phys.* 89(11):7000-7002, 2001.
Shang et al., *J. Appl. Phys.* 89(11):7368-7370, 2001.
Shang et al., *J. Appl. Phys.* 91(10):7703-7705, 2002.
Shi et al., *IEEE Transactions on Magnetics* 34(4):997-999, 1998.
Shi et al., *App. Phys.Lett.* 74(17):2525-2527, 1999.
Shi et al., *Appl. Phys. Lett.* 76(18):2588-2590, 2000.
Sousa et al., *IEEE Transactions on Magnetics* 36(5):2770-2772, 2000.
Sousa et al., *IEEE Transactions on Magnetics* 37(4):1973-1975, 2001.
Sousa et al., *J. Appl. Phys.* 91(10): 7700-7702, 2002.
Tehrani et al., *IEEE Transactions on Magnetics* 36(5):2752-2757, 2000.
Zheng et al., *J. Appl. Phys.* 81(8):5471-5473, 1997.
Zhu et al., *J. Appl. Phys.* 87(9):6668-6673, 2000.
Kläui et al., *Applied. Physics Letters* 81(1):108-110, 2002.
Lopez-Diaz et al., *IEEE Transactions on Magnetics* 36(5):3155-3157, 2000.
Lopez-Diaz et al., *Journal of Applied Physics* 89(11):7579-7581, 2001.
Rothman et al., *Physical Review Letters* 86(6):1098-1101, 2001.

* cited by examiner

Fig. 10A
Fig. 10B
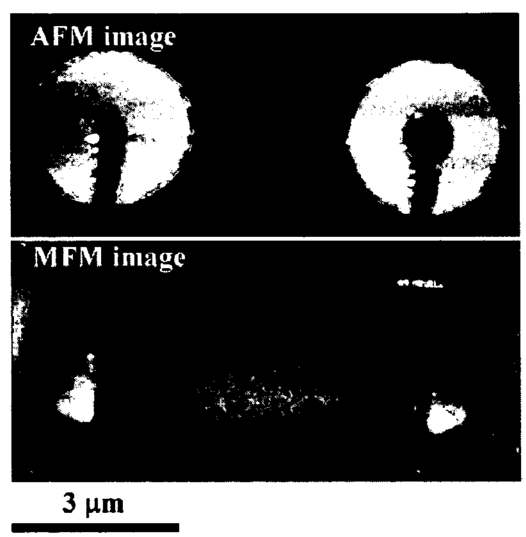
Fig. 10C
Fig. 10D
Fig. 11A
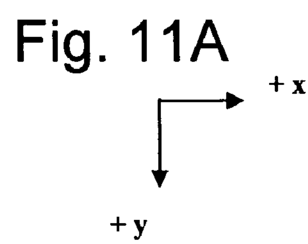
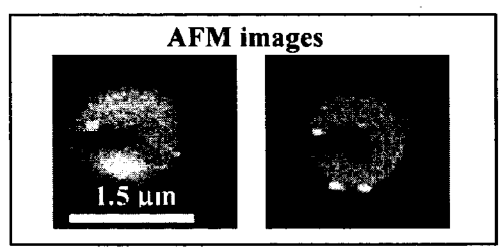
Fig. 11B
Fig. 11C
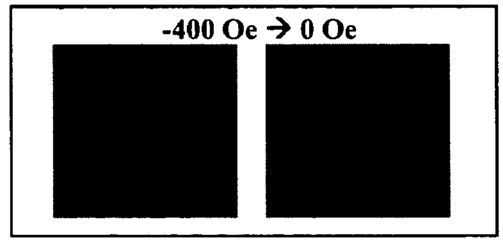
Fig. 11D
Fig. 11E
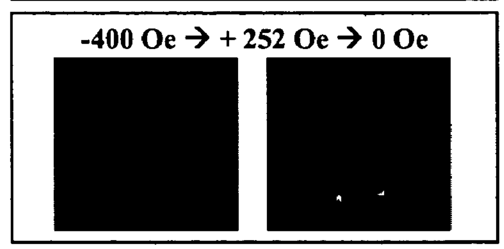
Fig. 11F
Fig. 11G
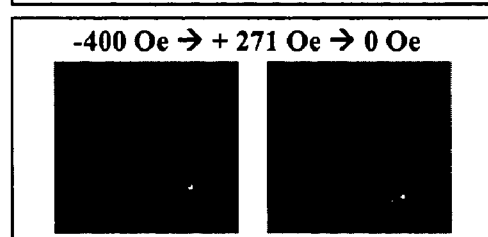
Fig. 11H

MAGNETIC ELEMENTS HAVING UNIQUE SHAPES

PRIORITY

This application claims priority to U.S. Provisional Application 60/416,213, filed Oct. 3, 2002, which is incorporated herein by reference.

STATEMENT OF GOVERNMENT SUPPORT

This invention was made with United States Government support under Contract N00014-02-1-0991 awarded by the United States Department of Naval Research. The United States Government has certain rights in the invention.

FIELD

The present disclosure relates to magnetic elements, particularly those useful for forming a magnetic tunneling junction.

BACKGROUND

A magnetic tunneling junction (MTJ) is formed by interposing a thin insulating layer between a pair of magnetic layers. When a voltage is applied between the two magnetic layers, electrons in one of the magnetic layers enter the other layer by passing through the insulating layer by quantum mechanical tunneling. The electrical resistance of the MTJ varies according to the direction of magnetization of the two magnetic layers. In particular, the electrical resistance of the MTJ has a minimum value when the directions of magnetization of the two magnetic layers are in parallel with each other, and has a maximum value when the directions of magnetization of the two magnetic layers are in an antiparallel relationship. If the direction of magnetization of one of the magnetic layers is changed by an applied magnetic field (external magnetic field) while the direction of magnetization of the other magnetic layer remains fixed, the electrical resistance value of the MTJ changes according to the direction of the applied magnetic field. This changing of the direction of the magnetization is referred to as "switching." Information can be stored in each MTJ and read out (i.e., reproduced) from the MTJ by sensing the tunneling current value.

One useful application of a MTJ is in a type of nonvolatile memory device known as a magnetic random access memory (MRAM) device. Each memory cell of the MRAM device incorporates a MTJ, and a plurality of memory cells are arranged in an addressable array. Magnetic tunneling junctions that have been employed in MRAM devices utilize magnetic elements having solid elliptical or modified rectangular shapes (e.g., hexagon). Such shapes exhibit a linear magnetization mode that produces several problems when they are scaled down to nanometer-sized elements. For example, edge magnetic domain, 360° domain walls, and localized vortices will occur leading to multiple magnetic domains. Such multiple magnetic domains cause unrepeatable switching and a non-uniform magnetization configuration of the magnetic element. Another significant issue with conventional magnetic element geometries, especially generally rectangular shapes with modified end portions, is the existence of a wide switching field distribution. Consequently, a large switching error occurs on individual memory cells.

In order to address the deleterious effects of the above-described magnet element shapes, a circular or an asymmetric circular magnet element has been proposed. However, for solid disc-magnetic elements having an asymmetric circular shape the vortex core interrupts the stability of the magnetic configuration in sub-micron-sized elements. More specifically, the vortex core is positioned on the center of a symmetrical disc, but in an asymmetrical design the location of the vortex core is not well defined. Consequently, the vortex core is unstable resulting in a high switching field and a wide switching field distribution. A ring-shaped magnetic element has also been proposed (see Prinz, U.S. Pat. No. 5,969,978). A ring-shaped magnetic element includes an isolated cavity or void that is difficult to accurately pattern with existing fabrication processes.

SUMMARY OF THE DISCLOSURE

Disclosed herein are unique magnetic elements, and magnetic tunneling junctions constructed from such magnetic elements.

For example, there is disclosed a magnetic element defining an outer peripheral profile and a center point, wherein the outer peripheral profile includes a substantially curviform section and a notch section. The notch section may be configured to radially extend to at least the center point. According to another variant, a magnetic element defines an outer periphery and a gap void having an open end facing the outer periphery so as to form a gap along the outer periphery, wherein the magnetic element does not include an annular void that is spatially isolated from the gap void.

There is also described a first example of a magnetic tunneling junction comprising a first magnetic layer and a second magnetic layer. Each one of the magnetic layers defines an outer peripheral profile and a center point, wherein the outer peripheral profile includes a substantially curviform section and a notch section. In one variation the notch section is configured to radially extend to at least the center point. The magnetic tunneling junction also includes an insulating layer interposed between the first magnetic layer and the second magnetic layer.

A second example of a magnetic tunnel junction includes a substantially circular or oval-shaped first magnetic layer and a substantially circular or oval-shaped second magnetic layer. Each of the magnetic layers defines an outer periphery and a gap void having an open end facing the outer periphery so as to form a gap along the outer periphery. In one variation the magnetic layer does not include an annular void that is spatially isolated from the gap void. The magnetic tunneling junction also includes an insulating layer interposed between the first magnetic layer and the second magnetic layer.

The disclosed structures and methods will become more apparent from the following detailed description of several embodiments.

BRIEF DESCRIPTION OF THE DRAWINGS

Certain embodiments are described below with reference to the following figures:

FIGS. 10A, 10B, 10C, and 10D are atomic force microscopy (AFM)/magnetic force microscopy (MFM) images showing magnetization configurations of several as-patterned magnetic elements;

FIGS. 11A–11H are MFM images of magnetization configurations of several magnetic elements at remanent state after applying successive magnetic fields;

DETAILED DESCRIPTION OF SEVERAL EMBODIMENTS

Figure 1:
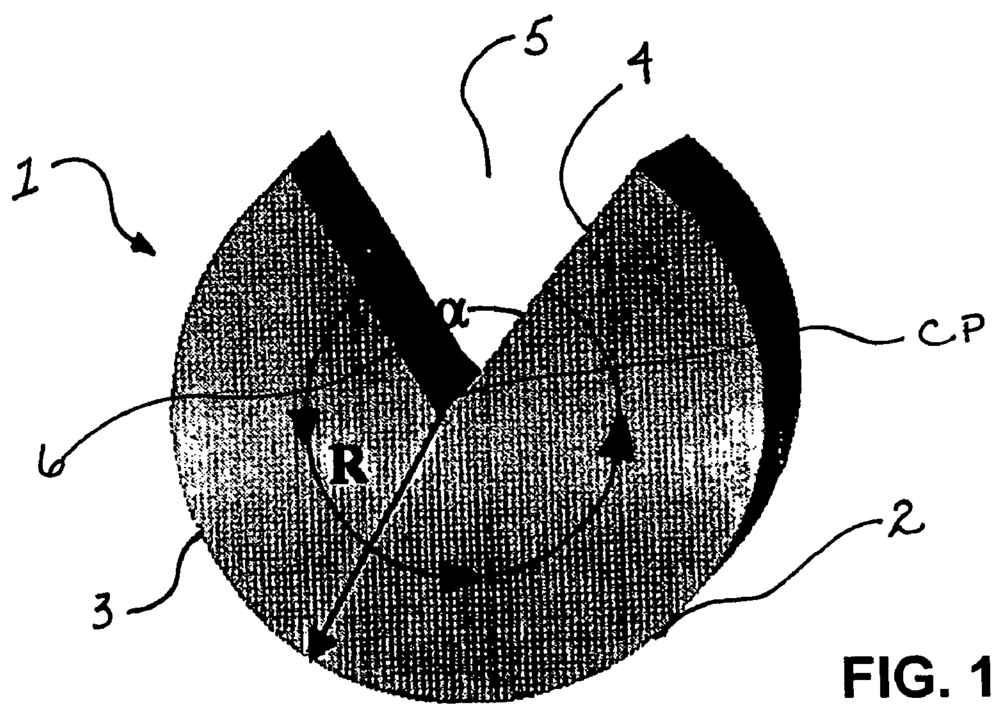
FIG. 1 is a perspective view of a first disclosed embodiment of a magnetic element.

The magnetic elements illustrated herein are generally curviform in overall shape. As used herein, "curviform" means a shape or line that include at least one curve. The circular or oval elements each include a gap or notch portion that forms a void at their outer periphery. Consequently, the profile of the outer periphery of the elements defines a discontinuous curve. The void typically extends to at least the center point of the curviform geometry of the elements. In other words, there may be a single void that extends in a radial direction from at or near the center point to the outer periphery of the element. The magnetic elements usually do not include a separate, annular void that is spatially isolated from the gap or notch void. A "spatially isolated" annular void means that there is magnetic structure between the annular void and the gap or notch void (i.e., the annular void and the gap or notch void are not in spatial communication with other). Several examples of possible geometries are shown in FIGS. 1–9 and 15A–15C. The magnetic elements may have other geometries in addition to those exemplified in the drawings.

With reference to FIG. 1, there is shown a circular magnetic element 1 that defines an outer periphery 2 that includes a curviform section 3 and a notch or gap section 4. The notch section 4 in FIG. 1 is generally wedge-shaped. The wedge-shaped notch section 4 defines an open end 5 that tapers into a closed end 6. The angle $\alpha$ formed by the wedge may range, for example, from about 1 to about 180° (see FIG. 15C which shows an element in which the angle $\alpha$ is 180°). The closed end 6 may be located at or near a center point CP of the circle formed by the outer periphery 2 of the element 1.

Figure 2:
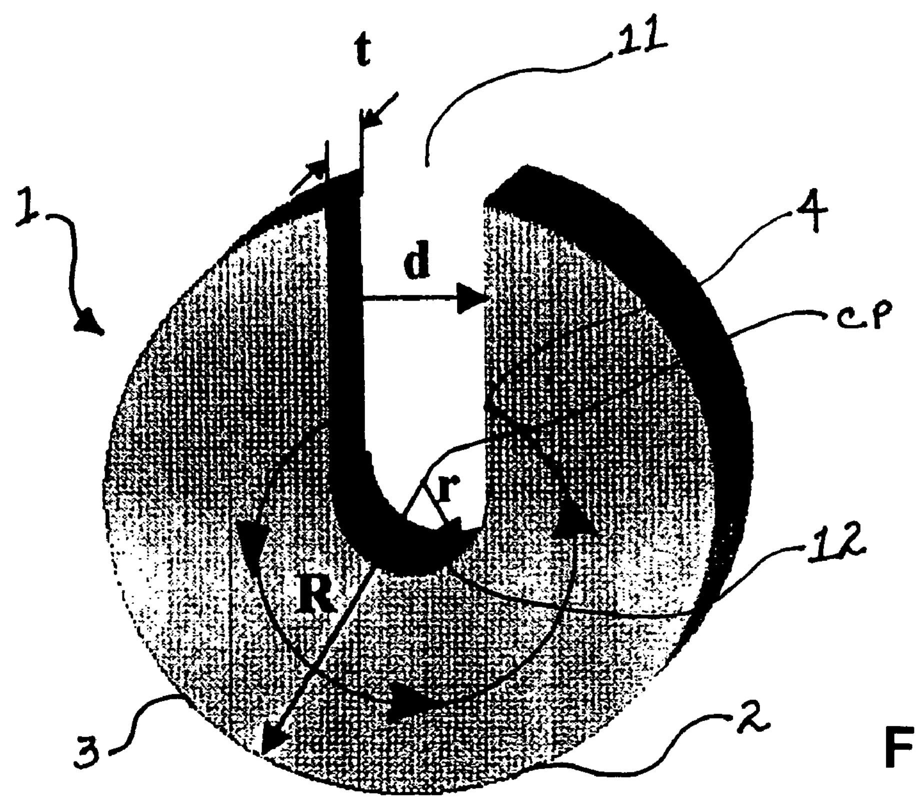
FIG. 2 is a perspective view of a second disclosed embodiment of a magnetic element.
Figure 3:
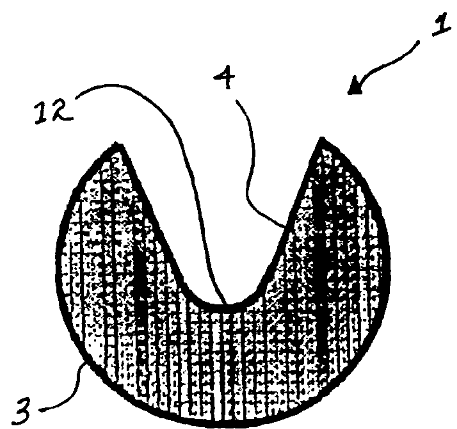
FIG. 3 is a cross-sectional view of a third disclosed embodiment of a magnetic element.
Figure 4:
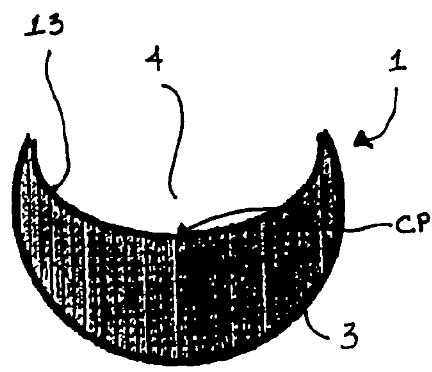
FIG. 4 is a cross-sectional view of a fourth disclosed embodiment of a magnetic element.
Figure 5:
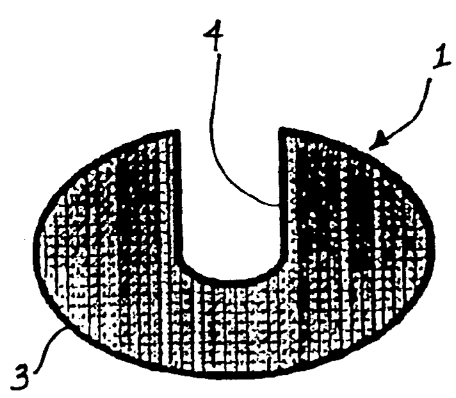
FIG. 5 is a cross-sectional view of a fifth disclosed embodiment of a magnetic element.
Figure 6:
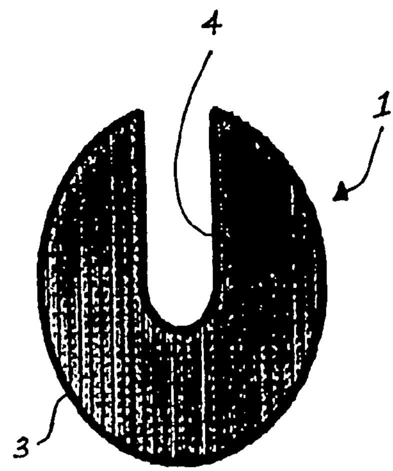
FIG. 6 is a cross-sectional view of a sixth disclosed embodiment of a magnetic element.
Figure 7:
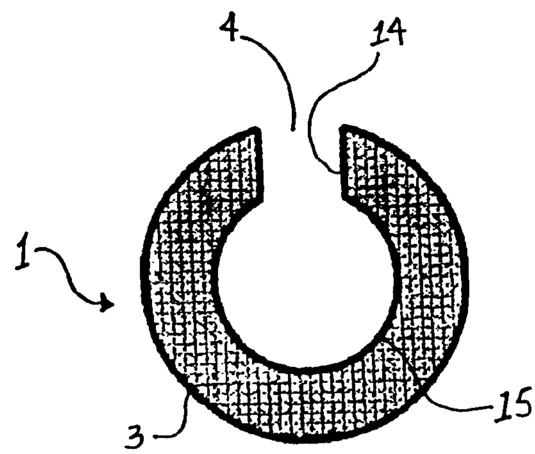
FIG. 7 is a cross-sectional view of a seventh disclosed embodiment of a magnetic element.

With reference to FIG. 2, there is shown another circular magnetic element 1 in which the notch section 4 defines a slot profile having an open end 11 facing the outer periphery 2 and a closed arcuate end 12 located at or near a center point CP of the circle formed by the outer periphery 2 of the element 1.

Figure 8:
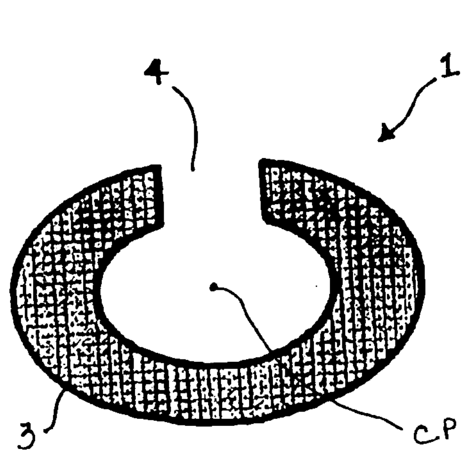
FIG. 8 is a cross-sectional view of an eighth disclosed embodiment of a magnetic element.
Figure 9:
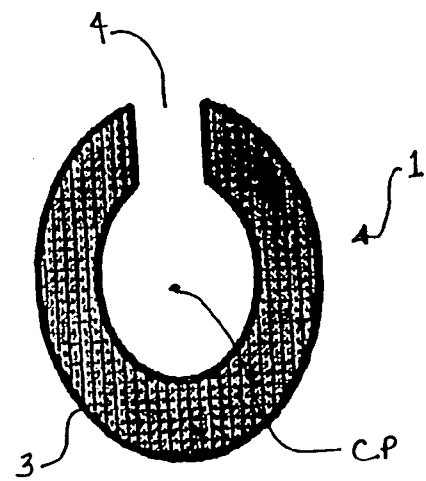
FIG. 9 is a cross-sectional view of a ninth disclosed embodiment of a magnetic element.

FIGS. 3–9 show other geometry variations for the magnetic element 1. The magnetic element 1 in FIG. 3 includes a wedge-shaped notch section 4 that defines an arcuate closed end 12. The magnetic element in FIG. 4 assumes a half-moon geometry in which the notch section 4 defines a parabolic-shaped profile 13. The center point CP of the half-moon is also identified in FIG. 4. The magnetic element in FIG. 5 has a generally oval or elliptical shape rather than a circular shape, and includes a notch section 4 similar to that shown in FIG. 2. The magnetic element in FIG. 6 also has a generally oval shape but the notch section 4 is aligned parallel to the radial direction of the longer diameter of the oval shape. The magnetic element in FIG. 7 includes a notch section 4 that defines a slot portion 14 that communicates with a circular portion 15. The circular portion 15 may be concentric with the center point of the element or it may be off-center from the center point. The magnetic element in FIG. 8 has a generally oval shape rather than a circular shape, and includes a notch section 4 similar to that shown in FIG. 7. The magnetic element in FIG. 9 also has a generally oval shape but the notch section 4 is aligned parallel to the radial direction of the longer diameter of the oval shape. The center point of the oval shapes in FIGS. 8 and 9 is designated "CP." In additional variations shown in FIGS. 15A–15C, the outer periphery 2 of the magnetic element 1 further includes a straight section 7 opposing the notch section 4.

The magnetic elements may have any dimensions that are required to meet the desired performance properties. For example, the outer radius R (see FIG. 2) from the center point of the curviform element geometry to the outer periphery may range from about 50 to about 1000 nm, more particularly about 100 to about 900 nm. The inner radius r (see FIG. 2) from the center point of the curviform element geometry to the arcuate or circular closed end of the notch section 4 may range from about 20 to about 900 nm, more particularly about 100 to about 800 nm. The thickness t (see FIG. 2) of the element may range from about 5 to about 500 nm, more particularly about 10 to about 100 nm. The gap distance d (i.e., the width of the slot section (see FIG. 2)) may range from about 20 to about 900 nm, more particularly about 50 to about 800 nm. The distance a from the center point of the curviform element geometry to the straight section 7 (see FIGS. 15A–15B) may be about one-third of the outer radius R. With respect to oval-shaped magnetic elements, the width or long dimension may be about 75 to about 1500 nm and the height or short dimension may be about 25 to about 500 nm.

The magnetic elements may be made from any magnetic-responsive material such as a ferromagnetic or ferrimagnetic material. Illustrative materials include cobalt-containing materials, nickel-containing materials, ferrous materials, chromium-containing materials, and alloys or mixtures made therefrom. Specific materials include Co, $Co_{50}Fe_{50}$, $CrO_2$, $Fe_3O_4$, Ni, NiFe (e.g., $Ni_{80}Fe_{20}$), $Ni_{50}Fe_{30}Co_{20}$, Fe, Co $CrO_2$, $Fe_3O_4$, and $La_{0.67}Sr_{0.33}MnO_3$.

The magnetic elements are particularly useful in nonvolatile MRAM devices that include a MTJ. As described above, a MTJ includes a first magnetic layer and a second magnetic layer. Both the first magnetic layer and the second magnetic layer are provided with a geometrical configuration in accordance with the magnetic elements described herein. An insulating layer is interposed between the first magnetic layer and the second magnetic layer. The geometrical configuration of the insulating layer may be the same as, or different from, the geometrical shape of the first and second magnetic layers.

The insulating layer generally has a thickness ranging from about 1 to about 10 nm. The insulating layer may be made from any magnetically insulating or non-magnetic material such as, for example, an aluminum oxide (e.g., $Al_2O_3$), nickel oxide, tantalum oxide, magnesium oxide, hafnium oxide, gadolinium oxide, aluminum nitride, aluminum oxynitride, boron nitride, zirconium oxide, $BaSr_{1-x}Ti_x$ (x=0.00 to 1), titanium oxide, and mixtures thereof. The composition of the first magnetic layer may be the same as or different than the composition of the second magnetic layer. The thickness of each of the first magnetic layer and the second magnetic layer may generally be the same as described above for the thickness t of the magnetic element.

One of the magnetic layers in the MTJ is known as the "free layer" since it is capable of reversing magnetization upon the direction of an applied, relatively small, magnetic field. The other magnetic layer in the MTJ is known as the "pinned layer" since its direction of magnetization remains constant while the free layer is undergoing a change in magnetization direction. Typically, the free layer is comprised of a "soft" magnetic material that can undergo magnetization direction reversal under a relatively lower magnetic coercive force. The pinned layer is comprised of a "hard" magnetic material that requires a relatively higher magnetic coercive force to induce a change in the magnetization direction.

The MTJ may be made by any technique used in forming nanometer layers in microelectronic devices. For example, the first magnetic layer is provided on a suitable substrate (e.g., glass, silicon, germanium, gallium arsenide, or mica) by a deposition technique such as chemical vapor deposition (e.g., plasma-enhanced chemical vapor deposition or vapor phase epitaxy) or physical deposition (e.g. sputtering, electroplating or evaporation). The insulating layer is provided on the first magnetic layer by another suitable deposition technique. If the insulating layer is an oxide, the insulating layer may undergo an oxidation treatment subsequent to deposition. The second magnetic layer then is provided on the insulating layer by a further deposition technique. Patterning techniques such as masking, etching and/or photolithography may be used to create the desired geometrical shape.

External magnetic fields may be applied to the MTJ disclosed herein by employing wiring configurations. Typically, a plurality of memory cells each using the above-described MTJ are arranged in matrix form and upper and lower wiring layers are laid over and under the memory cells. The upper and lower wiring layers are substantially perpendicular with each other while being spaced apart at a predetermined distance (e.g., the thickness of the memory cells) from each other. One of the wiring layers is formed of a low-electrical-resistance conductive material that is patterned to form a plurality of bit lines in a predetermined configuration. Similarly, the other wiring layer is formed of a low-electrical-resistance conductive material that is patterned to form a plurality of word lines in a predetermined configuration, which intersect the bit lines at right angles.

As mentioned above, each memory cell in the MRAM has two magnetic layers. One is a free or storage layer having a direction of magnetization changed according to the direction of an external magnetic field. The free layer may be electrically connected to the corresponding bit line or word line. The other layer is a pinned layer having a fixed direction of magnetization. The pinned layer may be electrically connected to the corresponding word line or bit line. When information is recorded (written) on a selected memory cell, the word and bit lines electrically connected to the memory cell are selected and predetermined write currents are caused to flow respectively through the word and bit lines. These write currents induce magnetic fields around the word and bit lines according to the values of the write currents. The direction of magnetization of the free layer changes according to a resultant magnetic field formed by the two induced magnetic fields.

If the direction of magnetization of the free layer changed in this manner is the same as the direction of magnetization of the pinned layer of the same memory cell, the directions of the free layer and the pinned layer are in parallel. If the changed direction of magnetization of the free layer is opposite to the direction of magnetization of the pinned layer, the directions of the free layer and the pinned layer are in anti-parallel. The direction of magnetization of the free layer is thus changed to write binary information "0" or "1" in the selected cell. To change the value written in the selected memory cell, one of the write currents caused to flow through the word and bit lines is reversed in direction (inverted). The direction of resultant magnetic field induced around the word and bit lines by the two write currents is thereby changed to reverse the direction of magnetization of the free layer, i.e., to write the other value.

Figure 12:
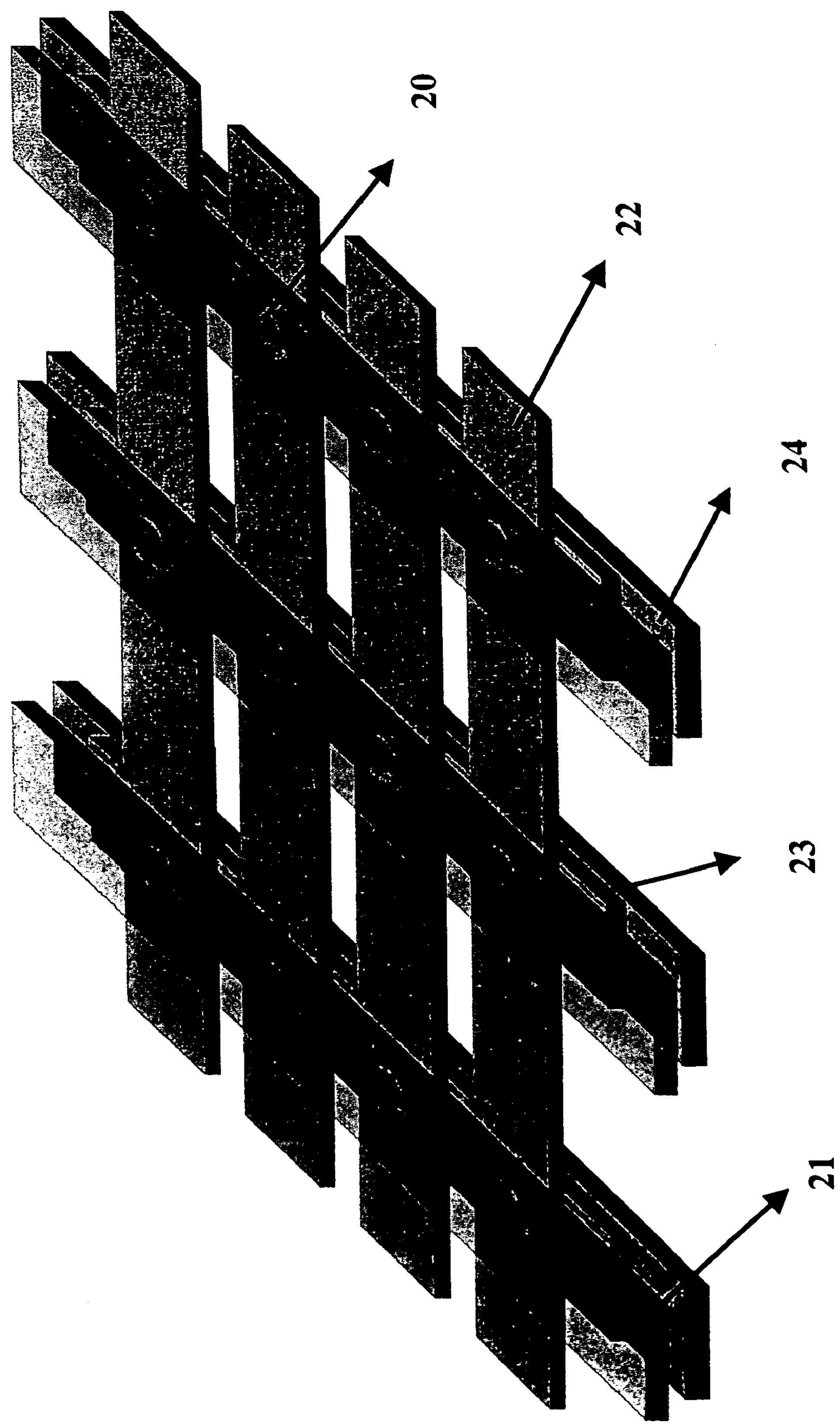
FIG. 12 is a schematic of a first wiring configuration for a novel MRAM device.

An example of a wiring configuration is depicted in FIG. 12. An array of MTJ elements 20 are arranged at the intersections of a plurality of word lines 21 and bit lines 22. The MTJ elements 20 are arranged so that the open end of each gap or notch section is pointing in substantially the same direction, thus providing uniform single domain magnetization across the array configuration. The MTJ element 20 is configured so that the free layer is in the same plane as the word line 21 and the pinned layer is in the same plane as the bit line 22. An electrically insulating layer 23 is provided adjacent to, and perpendicular to, the bit lines 22. A plurality of digit lines 24 are provided adjacent to the electrically insulating layer 23, and perpendicular to the bit lines 22. A current is supplied to the digit lines 24 in conjunction with a current supplied to the bit lines 22 for inducing a first magnetic field. This induced first magnetic field can switch (write) a MTJ element 20.

Figures 13A, 13B:
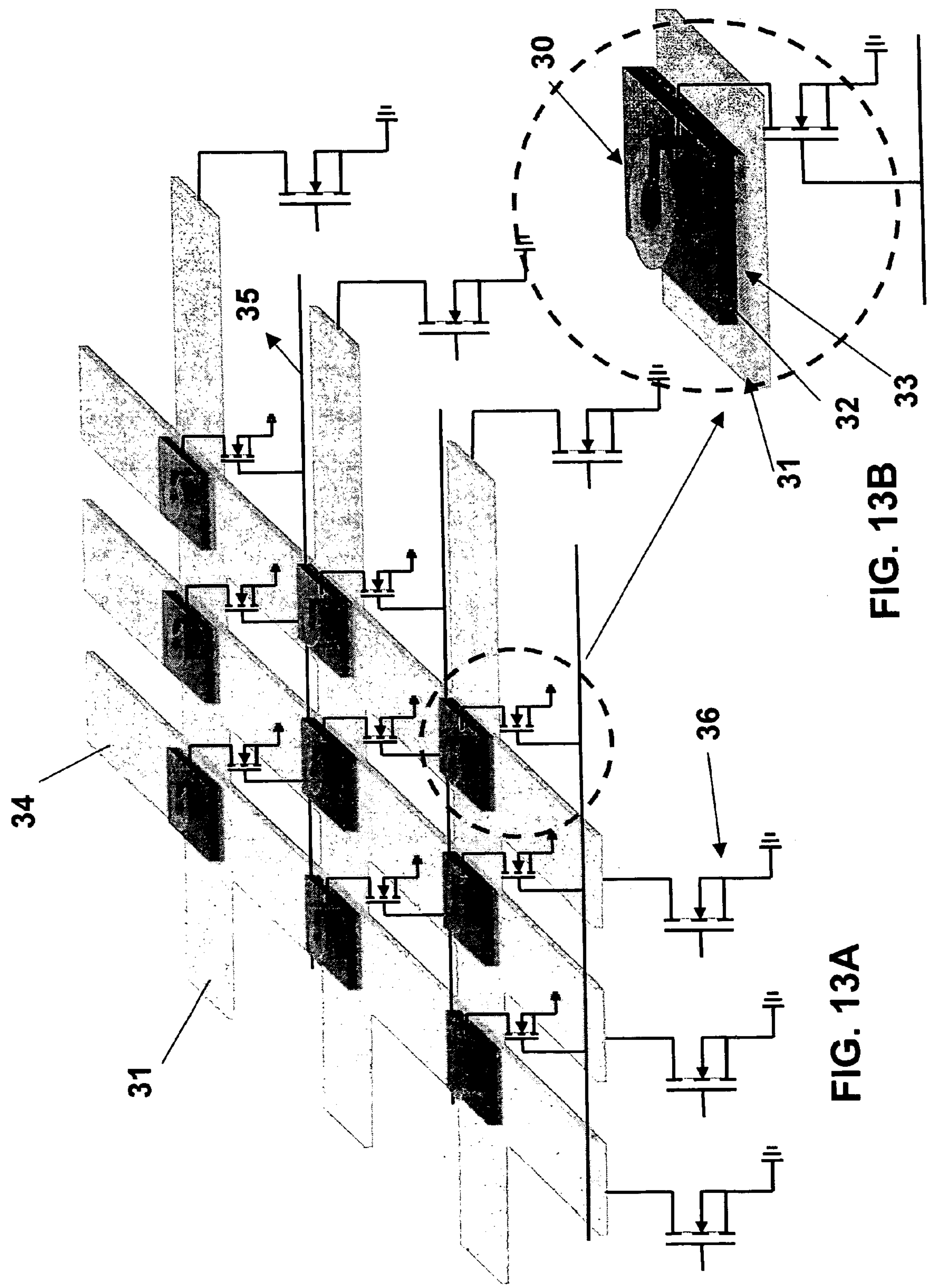
FIG. 13A is a schematic of a second wiring configuration for a novel MRAM device.
FIG. 13B is an enlarged schematic view of a MTJ wired according to the configuration shown in FIG. 13A.

A further example of a wiring configuration is illustrated in FIGS. 13A and 13B in which electrical connections of MTJ elements 30 with transistors 36 are shown. An array of MTJ elements 30 are arranged at the intersection of bit lines 34 and word lines 35. The MTJ elements 30 are arranged so that the open end of each gap or notch section is pointing in substantially the same direction, thus providing uniform single domain magnetization across the array configuration. A digit line 31 is provided perpendicular to the bit line 34. An electrode 32 is disposed around the outer periphery of the MTJ element 30. The electrode 32 serves as a contact point for line(s) leading to the transistor 36. A low k dielectric-insulating layer 33 is disposed between the electrode 32 and the digit line 31. The digit lines 31 and the bit lines 34 can produce a magnetic field to switch the MTJ elements 30 as described above. More specifically, current flowing through the digit line 31 produces a magnetic field along the easy direction (i.e., perpendicular to the direction of the open end of the gap or notch in the MTJ element 30). Simultaneously, current flowing through the bit line 34 produces a magnetic field along the hard direction that is perpendicular to the magnetic field produced by the digit line 31. Reading of the MTJ element 30 may be performed by a combination of the bit line 34 and the word line 35. More specifically, the current flowing through the word line 35 determines the status of the current flowing through the bit line 34 and the MTJ element 30, by turning on or off the transistors 36. The on-off bit signal is determined by comparing the electrical resistance of the addressed MTJ element 30 to that of a reference cell (not shown).

The unique shapes of the magnetic elements described herein can provide an improved low switching field and an exceptionally narrow switching field distribution.

Figure 14:
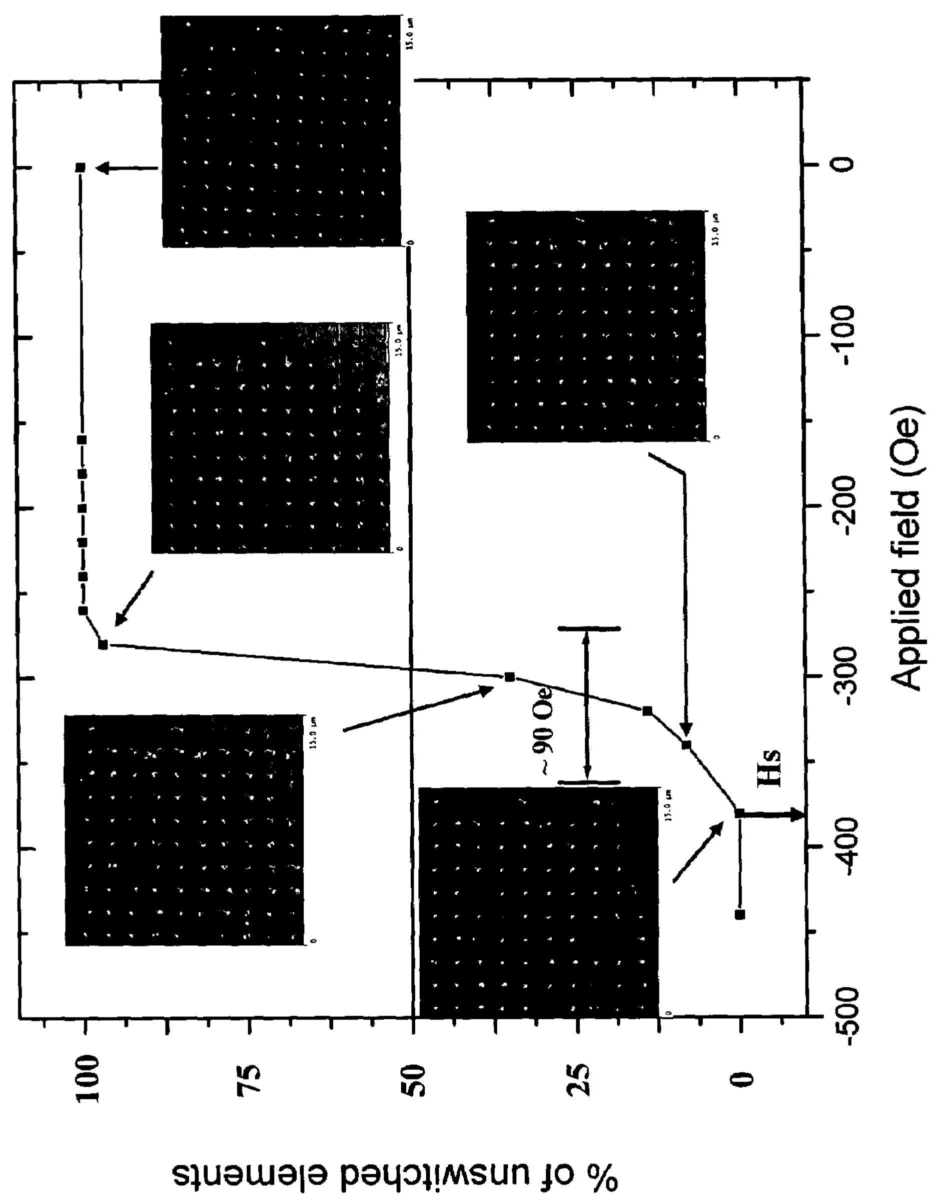
FIG. 14 is a graph illustrating a remanent curve of the percentage of unswitched magnetic elements vs. the applied magnetic field.
Figure 15C:
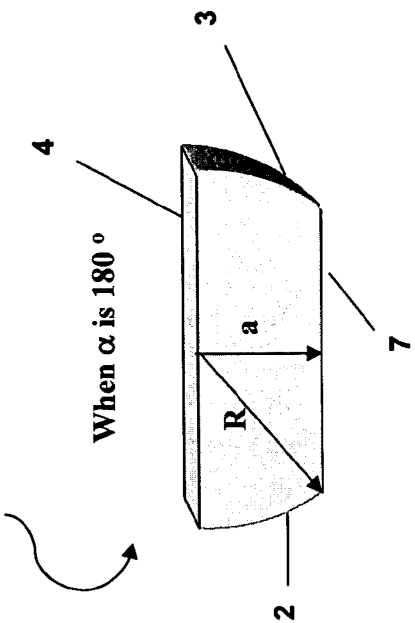
FIGS. 15A–15C are cross-sectional views of further disclosed embodiments of a magnetic element.
Figure 15A:
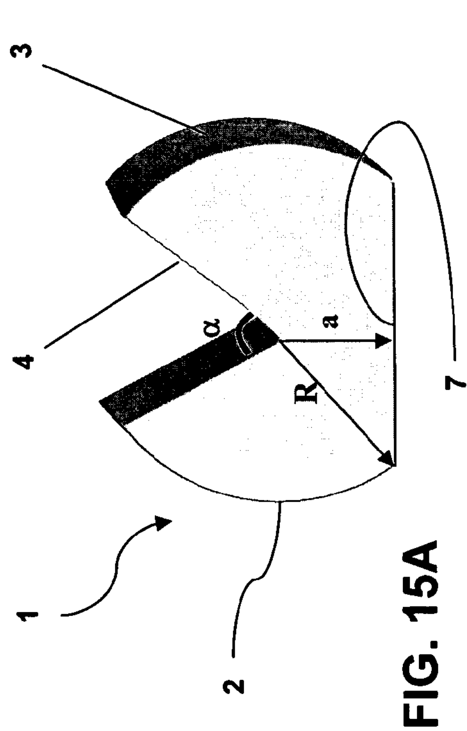
Figure 15B:
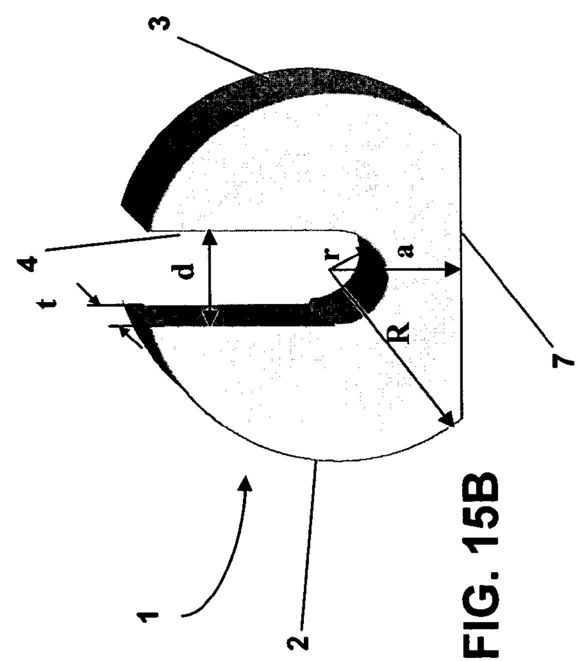

For example, FIG. 14 (described in more detail below) shows a switching field distribution of approximately 90 Oe. The switching field distribution of the element is dependent upon the geometry of the magnetic element, especially the gap distance d, the inner radius r, the outer radius R, the angle $\alpha$, and the layer thickness t. In general, the switching field distribution increases with increasing layer thickness t, increasing inner radius r, increasing gap distance d, decreasing the outer radius R, and decreasing the angle $\alpha$. Thus, a desired switching field range can be easily achieved by appropriately designing the geometry of the magnetic element.

The elements may be characterized by an asymmetric circular magnetization mode as depicted by the arrows in FIGS. 1 and 2, or a modified linear mode depending upon the geometry of the notch or gap section. Moreover, the layers may exhibit single domain magnetization, are substantially free of edge magnetic domain, 360° domain walls, and localized vortices. Although not bound by any theory, it is believed that these properties flow, at least in part, from the shape anisotropy of the layers. The magnetization states of the magnetic layers of the MTJ can be controlled by in-plane external magnetic fields and substantially no vortex core exists. The magnetic elements described herein also can increase the information data storage density of MRAM devices.

The specific examples described below are for illustrative purposes and should not be considered as limiting the scope of this disclosure.

EXAMPLES

The magnetic domain configuration of several notch- or gap-shaped magnetic elements were observed under a magnetic force microscope (MFM) and an atomic force microscope (AFM). The domain configurations at remanent state were studied by MFM for the switching behavior of the magnetic elements under a successively applied magnetic field.

The magnetic elements were made by initially forming a positive poly(methyl methacrylate) (PMMA) mask pattern on a naturally-oxidized Si wafer. The PMMA mask was fabricated using electron beam processing. A nanometer film was then deposited on the geometrical area not covered by the PMMA via conventional rf non-magnetron sputtering. The film comprised an adhesive layer of 35 nm of Ti adjacent to the Si surface, a middle layer of 32 nm of Co, and a cap layer of 35 nm of Ti disposed on top of the Co layer. No magnetic field was applied during the deposition. The PMMA then was removed by etching.

The MFM images of FIG. 10 demonstrate that the uniquely-shaped magnetic elements exhibit a uniform single magnetic domain since no boundaries (i.e., walls) between domains are visible. FIG. 10A is an AFM image of a magnetic element configured with a slot-shaped gap. FIG. 10B is an AFM image of a magnetic element configured with a gap section that defines a slot-shaped portion and a circular-shaped portion. FIGS. 10C and 10D are MFM images of the magnetic elements shown in FIGS. 10A and 10B, respectively.

The MFM images of FIG. 11 illustrate the magnetic domain configurations at remanent state after successively applied magnetic fields. A field of −400 Oe was initially applied in the −y direction to saturate the magnetic element, and then a successive field was applied in the +y direction. FIG. 11A is an AFM image of a magnetic element configured with a slot-shaped gap. FIG. 11B is an AFM image of a magnetic element configured with a gap section that defines a slot-shaped portion and a circular-shaped portion. FIGS. 11C and 11D are MFM images of the magnetic elements shown in FIGS. 11A and 11B, respectively, after application of an initial −400 Oe field. FIGS. 11E and 11F are MFM images of the magnetic elements shown in FIGS. 11A and 11B, respectively, after application of an initial −400 Oe field followed by a +252 Oe field. FIGS. 11G and 11H are MFM images of the magnetic elements shown in FIGS. 11A and 11B, respectively, after application of an initial −400 Oe field followed by a +271 Oe field. The magnetic domain configuration results indicate that the magnetic element having a gap section that defines a slot-shaped portion and a circular-shaped portion has a lower switching field compared to the magnetic element having only a slot-shaped gap.

The switching field distribution of magnetic elements having a wedge-shaped gap section was observed by scanning the magnetic domain configurations utilizing a MFM. The number of switched elements in an array of 100 elements were counted after successively applied magnetic fields. The successively applied fields were +440 Oe, remanent state (0 Oe), a selected negative field, and then back to a remanent state (0 Oe). The resulting remanence curve is shown in FIG. 14.

What is claimed is:

1. A magnetic tunnel junction comprising:

a substantially circular or oval-shaped first magnetic layer and a substantially circular or oval-shaped second magnetic layer, each magnetic layer defining an outer periphery and a gap void having an open end facing the outer periphery so as to form a gap along the outer periphery, wherein the magnetic layer does not include an annular void that is spatially isolated from the gap void; and an insulating layer interposed between the first magnetic layer and the second magnetic layer.

2. The magnetic tunneling junction of claim 1, wherein the gap void comprises a wedge shape.

3. The magnetic tunneling junction of claim 1, wherein the gap void comprises a slot-shaped section and a circular-shaped or oval-shaped section.

4. The magnetic tunneling junction of claim 1, wherein the gap void comprises a parabolic shape.

5. The magnetic tunneling junction of claim 1, wherein the gap void comprises a slot-shaped portion and a circular-shaped or oval-shaped portion.

6. The magnetic tunneling junction of claim 1, wherein the first magnetic layer and the second magnetic layer define the same outer periphery shape.

7. The magnetic tunneling junction of claim 6, wherein the insulating layer defines an outer periphery having the same shape as the outer periphery of the first magnetic layer and the second magnetic layer.

8. A magnetic random access memory device comprising the magnetic tunneling junction of claim 1.

9. The magnetic tunneling junction of claim 2, wherein the wedge shape defines an angle of about 1° to about 180°.

10. The magnetic tunneling junction of claim 3, wherein the slot-shaped section defines a gap distance of about 20 mm to about 900 mm.

11. A substantially circular-shaped or oval-shaped magnetic element defining an outer periphery and a gap void having an open end facing the outer periphery so as to form a gap along the outer periphery, wherein the magnetic element does not include an annular void that is spatially isolated from the gap void.

* * * * *